United States Patent [19]

Ohhinata

[11] 4,066,915
[45] Jan. 3, 1978

[54] MEMORY CIRCUIT

[75] Inventor: Ichiro Ohhinata, Yokohama, Japan

[73] Assignee: Hitachi, Ltd., Japan

[21] Appl. No.: 712,261

[22] Filed: Aug. 6, 1976

[30] Foreign Application Priority Data

Aug. 9, 1975 Japan .................................. 50-96999

[51] Int. Cl.² ...................... G11C 11/34; H03K 17/72
[52] U.S. Cl. .................................... 307/238; 307/213;
307/252 A; 307/252 G; 307/299 A; 307/299 B;
365/180
[58] Field of Search ................... 307/213, 238, 252 A,
307/252 G, 305, 299 A, 299 B; 340/173 R, 173
NR

[56] References Cited

U.S. PATENT DOCUMENTS

| 3,918,033 | 11/1975 | Case et al. | 307/238 X |
| 3,986,177 | 10/1976 | Picquendar et al. | 307/238 X |

*Primary Examiner*—John Zazworsky
*Attorney, Agent, or Firm*—Craig & Antonelli

[57] ABSTRACT

A memory circuit is comprised of a memory cell of PNPN- equivalent 4-layer construction, a selective input circuit composed of a pair of an NPN transistor and a PNP transistor, and a read-out circuit for reading the information stored in the memory cell. The emitters of the transistors included in the selective input circuit are connected to one of the selective input terminals, the bases thereof to the other selective input terminal, the collector of one of the transistors to the write input terminal of the memory cell, and the collector of the other transistor to the input terminal of the read-out circuit. Thus, both the writing and reading operations are controlled from the same selective input terminal, and power consumption of the selective input circuit in the holding mode is substantially zero.

9 Claims, 9 Drawing Figures

FIG. 1
PRIOR ART
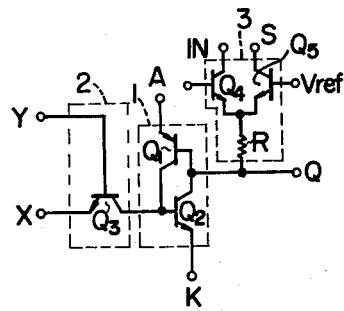
FIG. 2
PRIOR ART
| X | Y | $Q_{N+1}$ | MODE |
|---|---|---|---|
| 1 | 1 | ON | WRITE "ON" |
| 0 | 1 | OFF | WRITE "OFF" |
| 1 | 0 | $Q_N$ | HOLD |
| 0 | 0 | $Q_N$ | HOLD |
FIG. 3
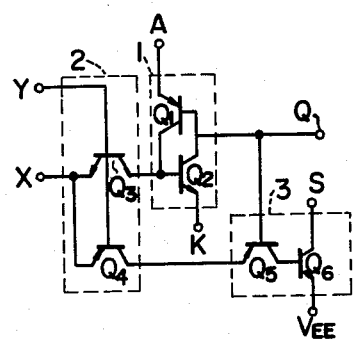
FIG. 4
| X | Y | $Q_{N+1}$ | MODE |
|---|---|---|---|
| 1 | 1 | ON | WRITE "ON" |
| 0 | 1 | OFF | WRITE "OFF" |
| 1 | 0 | $Q_N$ | READ |
| 0 | 0 | $Q_N$ | HOLD |
FIG. 5
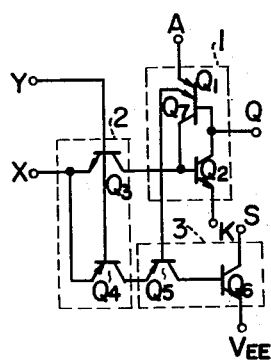
FIG. 6
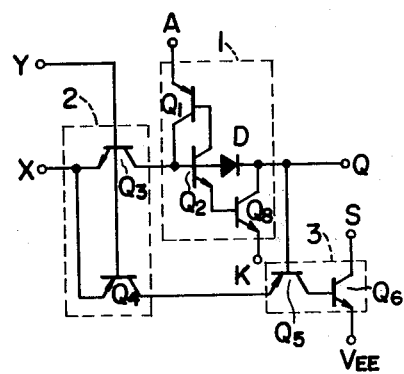

FIG. 7
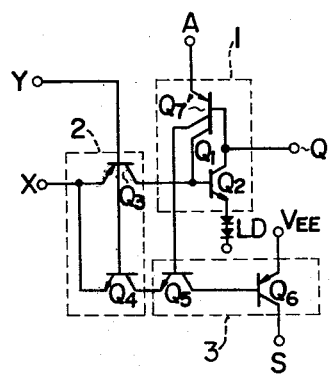
FIG. 8
| X | Y | $Q_{N+1}$ | MODE |
|---|---|---|---|
| 1 | 1 | $Q_N$ | HOLD |
| 0 | 1 | $Q_N$ | READ |
| 1 | 0 | ON | WRITE "ON" |
| 0 | 0 | OFF | WRITE "OFF" |
FIG. 9
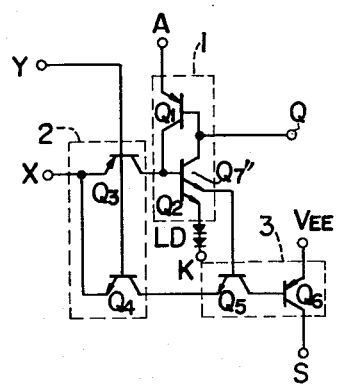

MEMORY CIRCUIT

BACKGROUND OF THE INVENTION

1. Field of the Invention

This invention relates to a memory circuit, or more in particular to a semiconductor memory circuit including a PNPN construction and being small in power consumption.

2. Description of the Prior Art

The construction of a semiconductor memory circuit is available in two types. One is a symmetric circuit such as a flip-flop circuit which consumes power in "on" and "off" states or "1" and "0" states; and the other is an asymmetric circuit which consumes no power in "off" state taking advantage of the self-holding ability of the PNPN construction. The former has excellent characteristics of high stability and responsiveness in operation and finds many applications. One of the advantages of the latter, on the other hand, is small power consumption and is effectively utilized in the fields where low power consumption is imperative, thus making possible a highly efficient memory. The memory circuit used as a holding circuit for the speech path switch in the telephone exchange, for example, is most frequently held in "off" state and therefore its low power consumption is almost vital.

A well-known asymmetric memory circuit with PNPN construction is shown in FIG. 1. In this drawing, reference numeral 1 designates a memory cell, numeral 2 a selective input section and numeral 3 a selective read-out section. This circuit operates in accordance with the truth table of FIG. 2. The circuit of FIG. 1 has the excellent feature that neither the memory cell 1 of PNPN construction including the transistors $Q_1$ and $Q_2$ nor the selective input section 2 including the transistor $Q_3$ consumes power when the memory circuit is held "off". In this circuit configuration, however, the writing operation of the memory cell 1 is performed directly by selecting the memory cell 1 according to the inputs X and Y. In reading the "on" or "off" state in which the memory cell 1 is held, it is necessary to use a selector circuit 3 other than the selective input section 2. Provision of separate selector circuits with individual input terminals for writing and reading operations is uneconomical in view of an increased number of terminals required for integrated circuit construction as well as an increased number of controlled gates in the stage preceding to the selector circuits and complicated control operation. The increased number of controlled gates in the preceding stage consumes more electric power and therefore is undesirable.

SUMMARY OF THE INVENTION

An object of the present invention is to provide a memory circuit so configured that the writing and reading operations of the memory cell of PNPN construction are controlled with a common selective input without ruining the feature of low power consumption in "off" state.

According to the present invention, there is provided a memory circuit comprising a memory cell of a PNPN-equivalent 4-layer construction, a selective input circuit composed of a pair of an NPN transistor and a PNP transistor, and a read-out circuit for reading the information stored in the memory cell, in which the emitters of the transistors included in the selective input circuit are connected to one of the selective input terminals, the bases thereof to the other selective input terminal, the collector of one of the transistors to the write input terminal of the memory cell, and the collector of the other transistor to the input terminal of the read-out circuit.

BRIEF DESCRIPTION OF THE DRAWINGS

FIG. 1 is a diagram showing a conventional memory circuit,

FIG. 2 is a truth table for explaining the operation of the circuit in FIG. 1.

FIG. 3 is a diagram showing a first embodiment of the memory circuit according to the present invention.

FIG. 4 is a truth table for explaining the operation of the memory circuit of FIG. 3.

FIG. 5 is a diagram showing a second embodiment of the memory circuit according to the present invention.

FIG. 6 shows a third embodiment of the memory circuit according to the present invention.

FIG. 7 is a diagram showing a fourth embodiment of the invention.

FIG. 8 shows a truth table for explaining the operation of the circuit of FIG. 7.

FIG. 9 is a diagram showing a fifth embodiment of the present invention.

DESCRIPTION OF THE PREFERRED EMBODIMENTS

A circuit diagram showing an embodiment of the memory circuit according to the present invention is illustrated in FIG. 3. Reference numeral 1 designates a memory cell of PNPN construction including a PNP transistor $Q_1$ and an NPN transistor $Q_2$, numeral 2 a selective input circuit including a write NPN transistor $Q_3$ and a read PNP transistor $Q_4$, and numeral 3 a read-out circuit including a PNP transistor $Q_5$ and an NPN transistor $Q_6$. A terminal to which the bases of the transistors $Q_3$ and $Q_4$ of the selective input circuit 2 are connected in common is termed a Y input terminal, and a terminal to which the emitters thereof are connected in common, an X input terminal. A terminal connected to the collector of the NPN transistor of the memory cell 1 is termed a Q output indicating the state of the memory cell. This circuit operates in accordance with the truth table shown in FIG. 4. In other words, when a "1" signal is applied to the X input in response to a "1" signal applied to the Y input terminal, a base current is supplied to the transistor $Q_2$ through the transistor $Q_3$ thereby to write the "on" state in the memory cell 1. When a "0" signal is applied to the X input terminal in response to a "1" signal applied to the Y input terminal, on the other hand, a base current of the transistor $Q_2$ is drawn through the transistor $Q_3$, thereby writing "off" in the memory cell 1. In the process, the PNP transistor $Q_4$ is held "off" with its Y input at "1" level, and therefore the read transistor $Q_5$ is also held "off" and performs no reading operation, thus keeping the power consumption in the read-out circuit 3 at zero.

Now, assume that a "0" signal is applied to the Y input terminal. The transistor $Q_3$ is turned "off" so that no data is written into the memory cell 1, and therefore the memory cell 1 is held in the same state as the previous state. Under this condition, when a "1" signal is applied to the X input terminal, the PNP transistor $Q_4$ is turned "on" so that the collector current flows thereby to make the reading operation possible. In other words, when the memory cell 1 is in "on" state, the base current of the PNP transistor $Q_5$ flows into the memory cell 1, thereby turning "on" the read output transistor $Q_6$; while if the memory cell is "off", no base current flows in the transistor $Q_5$ and therefore the read output transistor $Q_6$ is also "off". This is equivalent to say that when the Y input and X input are "0" and "1" respectively, the read output transistor $Q_6$ is turned "on" or "off" to perform the reading operation in accordance with the data stored in the memory cell. Character S shows a read output terminal. When both the Y and X input terminals are "0", by contrast, no base current is supplied to the read output transistor $Q_6$ and therefore the read transistor $Q_6$ is held "off" even if the memory cell 1 is in "on" state, thus preventing any reading operation, holding the memory circuit.

The circuit configuration of FIG. 3 can prevent the waste of power. Since the memory cell 1 has a PNPN construction, the power consumption thereof in "off" state is substantially zero. In the write condition, substantially no power is consumed by the read-out circuit, while in the read state, the power consumption by the write circuit is almost zero. When the memory circuit is held "off" with both the Y and X inputs "0", substantially no power is consumed at the write circuit and the read circuit.

Another embodiment of the memory circuit according to the present invention is shown in FIG. 5 and makes up a modification of the memory circuit of FIG. 3 in that the manner of reading the memory cell 1 is different. A transistor $Q_7$, having the common base and collector to the PNP transistor $Q_1$ of the memory cell 1, has the emitter thereof connected to the base of the read PNP transistor $Q_5$. It will be easily understood that this circuit also operates in accordance with the truth table of FIG. 4. Assume that the memory cell 1 is in the reading condition with the Y input at "0" and the X input "1". If the memory cell 1 is "on", current flows in at the emitter of the PNP transistor $Q_7$, while if the memory cell is "off", no emitter current of the transistor $Q_7$ flows. Such conditions are utilized for detection by the transistors $Q_5$ and $Q_6$, as in FIG. 3. The PNP transistors $Q_1$ and $Q_7$ of the memory cell 1 may be of a multi-emitter construction as is often the case in a semiconductor integrated circuit.

The memory cell of PNPN construction according to the present invention may assume various modifications.

Still another embodiment of the invention is shown in the memory circuit of FIG. 6, in which the memory cell 1 of PNPN construction is subjected to saturation control by the addition of a transistor $Q_8$ and a diode D. In the drawing under consideration, reference numerals 2 and 3 designate a selective input circuit and a read-out circuit respectively, as in FIG. 3, the memory circuit operating in accordance with the truth table of FIG. 4.

The types of conduction of the selective input circuit and the read-out circuit according to the invention may be reversed with equal effect.

A further embodimemt of the memory circuit according to the present invention is shown in FIG. 7. In this embodiment, the memory cell 1 is subjected to level shift by the level shift diode LD. The PNP transistor $Q_3$ is used as the write transistor for the selective input circuit 2, and the NPN transistor $Q_4$ as the read transistor therefor. The collector of the PNP transistor $Q_7$, having the common emitter and base to the PNP transistor $Q_1$ of the memory cell 1 is connected to the base of the read NPN transistor $Q_5$. This circuit operates in accordance with the truth table of FIG. 8. In contrast with the circuit shown in FIG. 3, in response to the "0" state of the Y input, the write transistor $Q_3$ of the selective input circuit 2 is turned "on", so that the "on" or "off" data according to the X input is written in the memory cell 1. When the Y and X inputs are "1" and "0" respectively, on the other hand, the read transistor $Q_4$ of the selective input circuit 2 is turned "on", and if the memory cell is "on", the read output transistor $Q_6$ is turned "on" through the transistors $Q_7'$ and $Q_5$. If the memory cell 1 is "off", by contrast, the read output transistor $Q_6$ is turned "off". Thus it is possible to read the condition of the memory cell 1 from the read output terminal S.

A further embodiment of the memory circuit according to the present invention is shown in FIG. 9. As in the case of the circuit of FIG. 7, the memory circuit of FIG. 9 operates according to the truth table of FIG. 8. The memory circuit shown in FIG. 9 is so configured that the transistor $Q_7''$ having the common base and collector to the transistor $Q_2$ making up the memory cell 1 has the emitter thereof connected to the base of the read transistor $Q_5$ thereby to read the data stored in the memory cell 1. The transistors $Q_1$ and $Q_7'$ in FIG. 7 and the transistors $Q_2$ and $Q_7''$ in FIG. 9, if constructed in semiconductor integrated circuits, may take the form of a multi-collector and multi-emitter construction respectively. The level shift diode LD is provided for setting the relative level of the circuit and is not limited to a diode but may be replaced with equal effect by a transistor, resistor or power supply for level adjustment by logic operation.

Although each of the preceding embodiments is comprised of transistors for fundamental operation, other types of elements may be added to the circuit in so far as the logic operation of the circuit is not adversely affected. The direct connection between the emitters and bases of the respective NPN and PNP transistors of the selective input circuit, for example, may be replaced by the interposition therebetween of an appropriate current-limiting resistor or level shift diode. Also, instead of connecting by transistors the selective input circuit directly to the memory cell, the selective input circuit directly to the read-out circuit and the memory cell directly to the read-out circuit, respectively, resistors or diodes may be interposed therebetween. Neither are the circuit configurations of the selective input circuit and the read-out circuit confined to those shown in the embodiments described above, but an appropriate level shift circuit or a current-limiting resistor may be inserted for performing the operation with a noise margin as a logic circuit. Furthermore, a circuit modification with various additional elements as shown in FIG. 6 may be employed as the memory cell of PNPN construction. For instance, a resistor may be connected to the collector of the transistor $Q_2$ in order to turn off the transistors $Q_1$ and $Q_2$ of the memory cell 1 by lowering the saturation level thereof. For the same purpose, a Schottky barrier diode may be inserted between the base and collector of the transistor $Q_2$. In addition, for the purpose of protecting the well-known $dv/dt$ effect of the PNPN construction, an impedance element or transistor may be inserted between the base and emitter of the transistor $Q_1$ or transistor $Q_2$. Still another modification of the invention is such that, in place of a single memory cell as used in the foregoing embodiments, a plurality of memory cells similar to the memory cell may be arranged in matrix to achieve a larger storage capacity.

It will be understood from the foregoing description that according to the present invention, it is possible by a simple circuit configuration to control the memory cell of PNPN construction at the same selective input terminal for a writing or a reading operation. During the write operation, the read-out circuit is held "off", and vice versa, so that substantially no power is consumed by the write circuit or read-out circuit, as the case may be, during the self-holding state of the circuit. This advantage, coupled with the feature of the zero "off" holding power of the memory cell of PNPN construction, contributes to the realization of a memory circuit which consumes low power by eliminating the waste thereof.

I claim:

1. A memory circuit comprising a memory cell of PNPN-equivalent 4-layer construction with a write terminal and a read terminal, selective input means composed of a pair of an NPN transistor and PNP transistor, and read-out means having two input terminals for reading information stored in said memory cell, wherein the emitters of said NPN transistor and said PNP transistor included in said selective input means are connected to one of two selective input terminals, the bases of said transistors are connected to the other of said two selective input terminals, the collector of one of said transistors is connected to the write terminal of said memory cell, and the collector of the other transistor is connected to one of the two input terminals of said read-out means and the other input terminal is connected to the read terminal of said memory cell.

2. A memory circuit comprising a memory cell of PNPN-equivalent 4-layer construction with a write terminal and a read terminal, selective input means composed of a pair of an NPN transistor and a PNP transistor and having two selective input terminals, and read-out means including an NPN transistor and a PNP transistor, the collector of said NPN transistor of said read-out means being connected to a read output terminal, the base of said NPN transistor of said read-out means being connected to the collector of said PNP transistor of said read-out means, the base of said PNP transistor of said read-out means being connected to the read terminal of said memory cell, the emitters of said transistors of said selective input means being connected to one of the two selective input terminals, the bases of said transistors of said selective input means being connected to the other of said selective input terminals, the collector of said NPN transistor of said selective input means being connected to the write terminal of said memory cell, the collector of said PNP transistor of said selective input means being connected to the emitter of said PNP transistor of said read-out means.

3. A memory circuit comprising a memory cell of PNPN- equivalent 4-layer construction with a write terminal and a read terminal, selective input means composed of a pair of an NPN transistor and a PNP transistor, and read-out means including a PNP transistor and an NPN transistor, the collector of said PNP transistor of said read-out means being connected to a read output terminal, the base of said PNP transistor of said read-out means being connected to the collector of said NPN transistor of said read-out means, the base of said NPN transistor of said read-out means being connected to the read terminal of said memory cell, the emitters of said transistors of said selective input means being connected to one of two selective input terminals, the bases of said transistors of said selective input means being connected to the other of said two selective input terminals, the collector of said PNP transistor of said selective input means being connected to the write terminal of said memory cell, the collector of said NPN transistor of said selective input means being connected to the emitter of said NPN transistor of said read-out means.

4. A memory circuit according to claim 1, in which said memory cell consists of a composite circuit including a PNP transistor and an NPN transistor, the base of said PNP transistor being connected to the collector of said NPN transistor, the base of said NPN transistor being connected to the collector of said PNP transistor.

5. A memory circuit according to claim 2, in which said memory cell consists of a composite circuit including a PNP transistor and an NPN transistor, the base of said PNP transistor being connected to the collector of said NPN transistor, the base of said NPN transistor being connected to the collector of said PNP transistor.

6. A memory circuit according to claim 3, in which said memory cell consists of a composite circuit including a PNP transistor and an NPN transistor, the base of said PNP transistor being connected to the collector of said NPN transistor, the base of said NPN transistor being connected to the collector of said PNP transistor.

7. A memory circuit according to claim 2, in which said memory cell consists of a composite circuit including a PNP transistor of multi-emitter construction and an NPN transistor, the base of said PNP transistor being connected to the collector of said NPN transistor, the base of said NPN transistor being connected to the collector of said PNP transistor, one of the emitters of said PNP transistor being used as the read terminal of the memory cell and connected to the base of said PNP transistor of said read-out means.

8. A memory circuit according to claim 3, in which said memory cell consists of a composite circuit including a PNP transistor and an NPN transistor of multi-emitter construction, the base of said PNP transistor being connected to the collector of said NPN transistor, the base of said NPN transistor being connected to the collector of said PNP transistor, one of the emitters of said NPN transistor being used as the read terminal of the memory cell and connected to the base of said NPN transistor of said read-out means.

9. A memory circuit according to claim 3, in which said memory cell consists of a composite circuit including a PNP transistor of multi-collector construction and an NPN transistor, the base of said PNP transistor being connected to the collector of said NPN transistor, the base of said NPN transistor being connected to the collector of said PNP transistor, one of two collectors of said PNP transistor being used as the read terminal of the memory cell and connected to the base of said NPN transistor of said read-out means.

* * * * *